United States Patent

[11] 3,568,108

[72] Inventors Armand R. Poirier
Nashua, N.H.;
Terry F. Newkirk, Lynnfield, Mass.
[21] Appl. No. 751,635
[22] Filed May 31, 1968
Division of Ser. No. 655,461, July 24, 1962, Patent No. 3,422,371.
[45] Patented Mar. 2, 1971
[73] Assignee Sanders Associates, Inc.
Nashua, N.H.

[54] THIN FILM PIEZOELECTRIC FILTER
5 Claims, 1 Drawing Fig.

[52] U.S. Cl. .......... 333/72, 333/30, 310/8.1, 179/110
[51] Int. Cl. .......... H03h 9/26
[50] Field of Search .......... 333/71, 72, 30; 310/8.1; 330/31, 35; 317/235; 332/31; 179/110

[56] References Cited

UNITED STATES PATENTS

| | | | |
|---|---|---|---|
| 3,274,406 | 9/1966 | Sommers, Jr. | 310/8.1 |
| 3,173,100 | 3/1965 | White | 330/35 |
| 3,414,832 | 12/1968 | Newell | 330/31 |
| 3,287,506 | 11/1966 | Hahnlien | 317/235 |
| 3,200,354 | 8/1965 | White | 333/30 |
| 3,413,573 | 11/1968 | Nathanson | 332/31 |

*Primary Examiner*—Herman Karl Saalbach
*Assistant Examiner*—C. Baraff
*Attorneys*—Louis Etlinger and Philip D. Amins

ABSTRACT: A thin film piezoelectric filter comprises a plurality of coaxially disposed resonators; each having a different but overlapping frequency-amplitude characteristic. The individual resonators are separated from one another by a selectively transmissive structure such that high-frequency acoustic waves produced in a first resonator are coupled in part to an adjacent resonator.

PATENTED MAR 2 1971 3,568,108
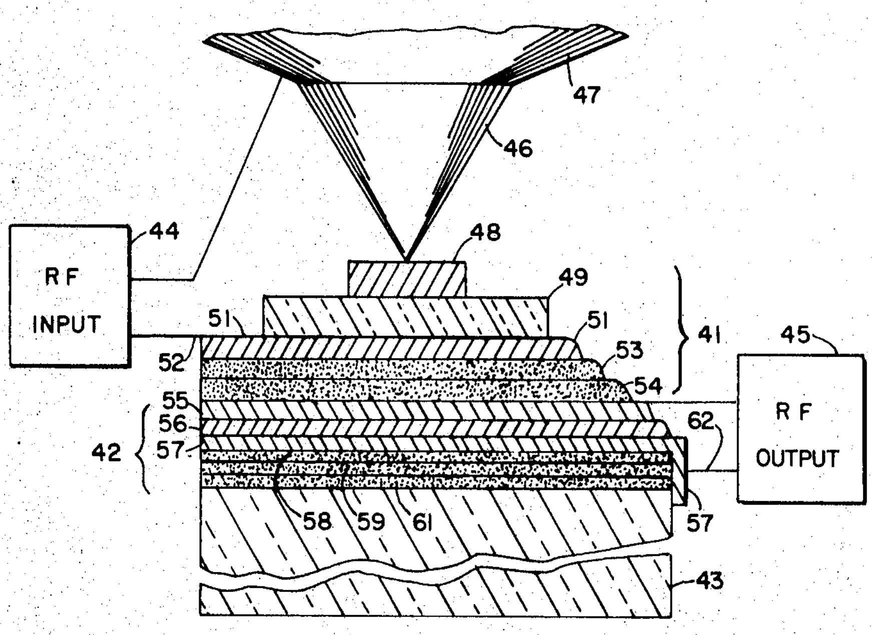
INVENTORS
ARMAND R. POIRIER
TERRY F. NEWKIRK
BY

THIN FILM PIEZOELECTRIC FILTER

The present application is a division of application Ser. No. 655,461 filed Jul. 24, 1967 and entitled "Thin Film Piezoelectric Device." The invention herein described was made in the course of a contract with the Department of the Navy.

This invention relates to piezoelectric semiconductor devices and more particularly to a thin film piezoelectric semiconductor device which is acoustically resonant.

Heretofore, piezoelectric crystals have been employed as passive resonators in conjunction with a driving circuit to provide a highly stable oscillator. Piezoelectric crystals such as quartz produce a highly stable electromechanical resonance up to about 150 MHz. They are usually employed in conjunction with a driving amplifier and provide positive feedback to the amplifier at the resonant frequency of the crystal so that the combination performs as an oscillator to generate the resonant frequency. Since the resonant frequency is dependent on the thickness of the piezoelectric crystal, the upper frequency limit of such an oscillator is limited by the smallest size that the crystal can be accurately cut. Consequently the generation of frequencies higher than 150 MHz. is generally accomplished with other devices such as klystrons or other vacuum tube devices.

It is one object of the present invention to provide a device exhibiting substantial electromechanical resonance at high frequencies in the range of 150 MHz. or greater.

Semiconductors which are crystalline materials, can be grown in very thin layers generally called epitaxial layers which may be only a few microns thick. Some single crystal semiconductors exhibit significant piezoelectric effect under appropriate conditions. These include ZnO, CdS, A1N, InAs, CdSe, CdTe, GaAs, GaP, ZnS and some others.

Some of these semiconductor materials (particularly CdS) are currently used quite effectively as transducers for converting high-frequency electrical waves into material or acoustic waves which are launched into a delay line. This work has led to multilayer thin film piezoelectric transducers. The transducer is made in a thin film deposited on the end of the delay line along with other thin films in an effort to match the acoustic characteristic impedance of the piezoelectric film in which the acoustic waves are generated, to the impedance of the delay line. Some efforts in this respect are described in an article by John deKlerk entitled "Multi Layer Thin Film Piezoelectric Transducers," in IEEE Transactions on Sonics and Ultrasonics; Aug., 1966, volume SU 13, No. 3, page 99.

It is a characteristic of piezoelectric semiconductor materials that an acoustic wave propagating through the material generates a piezoelectric field which interacts and exchanges energy with mobile charge carriers driven through the medium by an external DC electric field. The acoustic wave traveling through the piezoelectric semiconductor medium generates an alternating electric field which travels at the same velocity as the acoustic wave. When a DC voltage is applied to the medium, it creates a direct current, whereupon the alternating field tends to bunch the mobile charges in the material, increasing the local electric field which reacts upon the piezoelectric medium to produce additional acoustic wave components. The action is somewhat analogous to the interaction and exchange of energy between an a electron beam and *rf* wave fields in a traveling wave amplifier tube. Some of the features of an amplifier which makes use of this phenomenon are described in U.S. Pat. No. 3,173,100, entitled "Ultrasonic Wave Amplifier," which issued to D. L. White, March 9, 1965.

An electromechanical resonator comprises a thin film of suitable piezoelectric semiconductor material sandwiched between acoustic wave-reflecting interfaces defining an acoustic cavity resonant at a prescribed acoustic wave frequency. Electric and acoustic waves traveling parallel in this cavity exchange energy as described above and so the resonator, in effect, is resonant to the electric waves. This device has the advantage of very small dimensions relative to prior resonant devices, because it is the acoustic wavelength that dictates the dimensions of the device.

A plurality of such resonators can be cascaded to form a filter in which the acoustic waves travel from one resonator or to another through interfaces between the resonators that transmit part of the acoustic wave energy incident thereon. Thus, an electrical input signal applied to the one resonator will produce a corresponding filtered electrical signal at the other resonator.

Other features and objects of the present invention will be apparent from the following specific description taken in conjunction with the FIG. 1 which shows cascaded resonators constructed in accordance with the invention to provide a high-frequency electric wave filter of small dimensions.

Oriented thin films of CdS can be fabricated using certain vacuum deposition deposition techniques. One technique for depositing a thin film of CdS is to direct separate beams of cadmium and sulfur toward a substrate upon which the film is deposited. The process consists of evaporating cadmium and sulfur from separate molybdenum crucibles. The crucibles are heated by resistance heating with a tungsten wire and the temperature of each is monitored with a thermocouple. Each crucible is capped with a molybdenum lid having a hole in it. The evaporated cadmium and sulfur molecules are directed up through the hole, through a cold trap to the substrate upon which the film is deposited The cold trap serves to trap molecules which are not initially deposited on the substrate. Typical temperatures as monitored by thermocouples are 180° C. for the substrate, 270° C. for the cadmium, 130° C. for the sulfur. These temperatures will produce a deposition rate of about 0.1 micron per minute.

The thickness of the film is measured with a laser beam directed perpendicular to the film. The reflected laser beam is detected, amplified and recorded as a function of a time. A plot of this function is indicative of the interference pattern between the laser light reflected at the top and bottom interfaces of the film. Maximum intensity occurs when the CdS film is a multiple of one-half optical wavelengths thick.

Successful use of the above technique has been recorded D. K. Winslow and H. J. Shaw, working at the Microwave Laboratory, W. W. Hanscom Laboratory of Physics, Stanford University, California and quite clearly the technique can be employed to deposit a precisely measured thin film of some of the other piezoelectric semiconductor materials mentioned above.

An acoustic wave traveling in the direction of the C-axis of the hexagonal CdS crystal can be amplified by applying a DC drift potential of sufficient magnitude in the same direction. This DC field must be of sufficient magnitude to impart a drift velocity to mobile carriers in the semiconductor material and this drift velocity must be in the same direction and greater than the velocity of the acoustic wave. When these and other conditions are satisfied, the acoustic wave is amplified. Heretofore, CdS crystals of relatively large size (2mm. long in the direction of the C-axis) have been used in this manner to provide an amplifier. The above mentioned U.S. Pat. No. 3,173,100 describes such an amplifier. The patent also suggests that the amplifier can be located in a resonant electromagnetic wave cavity and will perform in conjunction with the cavity as an oscillator to generate high-frequency electrical waves. The frequency is established by the resonance of the electromagnetic cavity and it is suggested that such an oscillator can be designed to operate in the range from 200 MHz. to over 100 KMHz. depending upon the tuning of the electromagnetic wave cavity. Quite clearly, within this range of frequencies, the electromagnetic wave cavity is of some size. At 200 MHz., such an electromagnetic cavity will measure many centimeters in dimension and at 100 KMHz. it will measure many millimeters in dimension.

In the present invention, the piezoelectric semiconductor such as CdS is laid down in a thin film on a substrate which is designed to effectively reflect acoustic waves. The piezoelectric film thickness is equal to an integral number of half wavelengths of the acoustic wave energy which is to be generated in the piezoelectric film. The substrate includes an electrically conductive layer for bounding one end of a DC electrical field directed transverse to the plane of the film and parallel to the C-axis of the film. A second conductive film is then laid down upon the the piezoelectric semiconductor film and serves to bound the other end of the DC electric field. This second conductive film is of negligible thickness in terms of acoustic wavelength or is an integral number of quarter acoustic wavelengths in thickness. A gaseous interface at this second conductive film assures almost complete reflection of the acoustic waves back into the CdS film at this interface.

By this construction, there is formed within the thin film of piezoelectric semiconductor a resonant acoustic cavity which is resonant at the frequency of the acoustic waves.

When a DC (or AC) field is directed parallel to the C-axis of the CdS film, the high-frequency acoustic waves are in the longitudinal mode and travel parallel to the field. When the DC (or AC) field is directed transverse to the C-axis of the CdS film, the acoustic waves are in the shear mode and travel parallel to the field. In the embodiment of the present invention described herein, the acoustic waves travel transverse to the CdS film. Thus, the structures described herein can be made so that longitudinal or shear acoustic waves are generated by forming the epitaxial layer with the crystalline axis thereof in predetermined directions. Reference may be had to the prior art for methods and means for forming epitaxial films of various crystalline axis orientation of the suitable semiconductor materials mentioned herein.

An *rf* filter structure incorporating features of the invention is illustrated in the appended FIG. The filter includes two or more resonators 41 and 42 in acoustical series supported by a substrate 43. The resonators are connected so that acoustical wave energy flows from the input resonator 41 to the output resonator 42. Accordingly, the abutting ends of each of these resonators partially transmit and partially reflect the acoustic wave energy.

An electrical *rf* input signal from a source 44 is applied across the input resonator 41 and the filtered electrical *rf* output 45 is taken from across the output resonator 42.

At the input resonator 41 a point 46 at the end of a bellows 47 touches the electrically conductive film 48 laid down on the active film 49 of piezoelectric semiconductor material. The conductive film 48 serves in conjunction with another conductive film 51 beneath the film 49 to bound the *rf* field imposed on the material in film 49. Input *rf* signals are applied from the source 44 preferably by coupling to the film 49 via a transmission line 52 matched to the electrical impedance of resonator 41, and connected to films 48 and 51.

The film 49 is preferably $(n+1)\ \lambda/2$ in thickness. The conductive films 48 and 51 and a plurality of films such as 53 and 54 below film 51 are each preferably between $(n+1)\ \lambda/2$ and $(2n+1)\lambda/4$ in thickness and are alternately of relatively high and relatively low characteristic acoustical impedance so that these films (51, 53 and 54) partially reflect and partially transmit acoustic wave energy of wavelength $\lambda$ generated in the piezoelectric film 49.

The acoustic energy transmitted through the films 51, 53 and 54 enters resonator 42 through the electrically conductive film 55 immediately adjacent the films 53 and 54 and generate electrical waves in the passive piezoelectric semiconductor film 56 sandwiched between the conductive films 55 and 57. The acoustic waves which enter the passive piezoelectric film 56 resonate therein by virtue of partial transmission from the half wavelength layers (55, 54, 53 and 51) above and substantially total reflection from the odd quarter wave layers 57, 58, 59 and 61 [$(2n+1)\ \lambda/4$ in thickness] below. Thus, an *rf* electric signal is produced across the conductive films 55 and 57 which couple to an output transmission line 62 leading to the *rf* output.

The input *rf* electrical signal is filtered by virtue of the different acoustical frequency-amplitude characteristics of the resonators 41 and 42. The extend to which these characteristics of the resonators overlap substantially determines the electrical characteristics of the filter. More than two such resonators may be cascaded, as shown, to provide a great variety of filters with characteristics tailored for particular uses.

This completes the description of the present invention of a plurality of thin film piezoelectric resonators each including a resonant acoustic cavity useful to provide an *rf* filter. While substantial detail of the embodiment is included, these details are not to be construed as limitations of the invention as set forth in the accompanying claims.

We claim:

1. A thin film piezoelectric filter comprising:
   - a plurality of resonators coaxially disposed in acoustical series with respect to one another, each said resonator having a different but overlapping acoustic frequency-amplitude characteristic and each including:
     - an epitaxial film having both piezoelectric and semiconductive properties;
     - electrically conductive means disposed adjacent opposed surfaces of each said epitaxial film for defining an acoustically resonant cavity in at least a portion of the transverse dimension of said film;
   - means for applying a high-frequency electric field across a first one of said resonators to thereby produce high-frequency acoustic waves in said acoustically resonant cavity therein;
   - means disposed between said resonators for selectively transmitting acoustic wave energy of a preselected frequency whereby said transmitted acoustic wave energy produced in the acoustically resonant cavity of said first resonator is coupled to the acoustically resonant cavity of a second one of said resonators thereby producing high-frequency electric waves in said cavity; and
   - means coupled to said second resonator for coupling said high-frequency electric waves therefrom.

2. Apparatus as recited in claim 1 wherein the crystalline axes of each said epitaxial film are oriented such that said high-frequency acoustic waves produced therein are in the longitudinal mode.

3. Apparatus as recited in claim 1 wherein the crystalline axes of each said epitaxial film are oriented such that said high-frequency acoustic waves produced therein are in the shear mode.

4. Apparatus as recited in claim 1 wherein said selective transmitting means comprises a plurality of layers having alternately relatively high and relatively low characteristic acoustic impedance, each said layer being of a thickness between one-half wavelength of said acoustic wave and an odd number of quarter wavelengths of said acoustic wave.

5. Apparatus as recited in claim 1 a further including acoustic wave-reflecting means disposed adjacent said second resonator on the surface thereof opposite said selective transmitting means comprising a plurality of layers having alternately relatively high and relatively low characteristic acoustic impedance, each said layer being of a thickness substantially equal to an odd number of quarter wavelengths of said acoustic wave.